United States Patent [19]
Weng et al.

[11] Patent Number: 5,107,506
[45] Date of Patent: Apr. 21, 1992

[54] ERROR TRAPPING DECODING METHOD AND APPARATUS

[75] Inventors: Lih-Jyh Weng, Lexington; Bruce A. Leshay, West Boylston, both of Mass.

[73] Assignee: Digital Equipment Corporation, Maynard, Mass.

[21] Appl. No.: 469,924

[22] Filed: Jan. 25, 1990

[51] Int. Cl.$^5$ .......................................... H03M 13/00
[52] U.S. Cl. .................................. 371/39.1; 371/38.1
[58] Field of Search ...................... 371/39.1, 38.1, 40.1, 371/37.6, 37.1, 37.2

[56] References Cited

U.S. PATENT DOCUMENTS

| | | | |
|---|---|---|---|
| 3,162,837 | 12/1964 | Meggitt | 371/39.1 |
| 3,601,800 | 8/1971 | Lee | 371/37.6 |
| 4,117,458 | 9/1978 | Burghard et al. | |
| 4,584,686 | 4/1986 | Fritze | 371/37 |
| 4,648,091 | 3/1987 | Gajjar | 371/37 |
| 4,698,813 | 10/1987 | Erdel | 371/39.1 |
| 4,843,607 | 6/1989 | Tong | 371/37.1 |
| 4,852,098 | 7/1989 | Brechard et al. | 371/37.1 |
| 4,875,211 | 10/1989 | Murai et al. | 371/40.1 |

*Primary Examiner*—Jerry Smith
*Assistant Examiner*—Phung My Ghung
*Attorney, Agent, or Firm*—Cesari & McKenna

[57] ABSTRACT

An error correction system generates a residue for data symbols encoded in accordance with an (n,k) code which has a distance "d" and a generator polynomial g(x). If the residue contains fewer than "T" non-zero symbols, where T<d/2, the data symbols are assumed to be error free. If there are T or more non-zero symbols, the data symbols are assumed to contain errors and the residue symbols are manipulated to correct the errors, if possible. The residue symbols are thus encoded using an encoder constructed in accordance with the generator polynomial g(x) by loading the residue symbols and shifting the encoder "m" times, where m is a factor of k. The number of non-zero symbols are then counted. If there are fewer than T non-zero symbols in the encoded residue, the encoded symbols are combined with the corresponding symbols in the code word. Thus the first encoded residue symbol is combined with the $m^{th}$ code word symbol, the second residue symbol is combined with the m+$1^{st}$ code word symbol, et cetera. If there are more than T non-zero symbols, the residue symbols are again encoded by shifting the encoder another m times, and so forth. The encoder may include feedback paths which allow it to encode the symbols in one shift the equivalent of i shifts of a conventional encoder, where i≦m. Each feedback path includes multipliers which are associated with the expression $x^{r-i+j}$ modulo g(x), where r is the number of residue symbols and j=1,2 ..., i.

12 Claims, 3 Drawing Sheets

ERROR TRAPPING DECODING METHOD AND APPARATUS

FIELD OF THE INVENTION

The invention relates generally to error correction of data and more particularly to improved techniques for error trapping decoding and an improved decoder/encoder.

BACKGROUND

The importance of error correction coding of data in digital computer systems has increased greatly as the density of the data recorded on mass storage media, more particularly magnetic disks, has increased. With higher recording densities, a tiny imperfection in the recording surface of a disk can corrupt a large amount of data. In order to avoid losing that data, error correction codes ("ECC's") are employed to, as the name implies, correct the erroneous data.

Before a string of data symbols is recorded on a disk, it is mathematically encoded to form ECC symbols. The ECC symbols are then appended to the data string to form code words—data symbols plus ECC symbols—and the code words are then stored on the disk. When the stored data is to be accessed from the disk, the code words containing the data symbols are retrieved from the disk and mathematically decoded. During decoding any errors in the data are detected and, if possible, corrected through manipulation of the ECC symbols [For a detailed description of decoding see Peterson and Weldon, *Error Correction Codes*, 2d Edition, MIT Press, 1972].

Stored digital code words can contain multiple errors. One of the most effective types of ECC used for the correction of multiple errors is a Reed-Solomon code [For a detailed description of Reed-Solomon codes, see Peterson and Weldon, *Error Correction Codes*]. Error detection and correction techniques for Reed-Solomon ECC's are well known. Id. One such technique begins with again encoding the code word data to generate a new set of ECC symbols and then comparing this set of ECC symbols with the ECC symbols in the retrieved code word, i.e. the set of ECC symbols generated by the pre-storage encoding of the data, to detect any errors in the retrieved data. [For a detailed discussion of this error detection technique, see U.S. Pat. No. 4,413,339 issued to Riggle and Weng].

With this technique, the two sets of ECC symbols may be compared by exclusive OR'ing the corresponding symbols of each set. The resulting symbols, which are "residue"symbols, are then used to determine the locations and/or values of the errors. If all errors are found to occur within an n-k, or "r", symbol grouping of code word symbols, that is, within a "window" or r consecutive symbols, a relatively straight-forward forward decoding technique known as error trapping decoding may be used to correct them. Error trapping decoding corrects, for an (n,k) code, up to (n−1)/k errors per code word. The errors must all occur within an r-symbol window, however, such error patterns are the most common. This technique is most effective for low rate codes, that is, codes which encode a large number of data symbols into a small number of redundancy symbols ($r \ll k$).

The error trapping decoding technique starts with a counting of the non-zero residue symbols. If there are fewer than T non-zero symbols, where T is less than one-half the "distance" of the error correction code, it is assumed that the data symbols are error-free and the errors are in the redundancy symbols. Thus no error correction is required.

If there are more than T non-zero symbols, the residue symbols are manipulated in accordance with the same (n,k) error correction code used to encode the data symbols. This may be accomplished by loading the residue symbols into an encoder used to encode the data, and shifting the encoder with no serial input thereto. For each manipulation cycle, that is, each clocking of the encoder or each software iteration, a count of the non-zero (manipulated) residue symbols is taken. If the count is less than T, the manipulated symbols are combined with the code word symbols to correct them. If the count is greater than T, another manipulation cycle and counting operation are performed.

While error trapping decoding is a straight-forward error correction technique which is easily implemented, it is relatively slow. It involves repeatedly cycling an encoder and performing a time consuming counting operation, up to n times per code word. Thus error trapping decoding may be too slow for systems with high data transfer rates. Accordingly, a fast error trapping decoding technique is highly desirable.

SUMMARY

The invention is a method and apparatus for implementing an improved error trapping decoding scheme for use with data which has been encoded into n-symbol code words using an (n,k) cyclic error correction code of distance d with a generator polynomial g(x). To decode a particular code word, the decoding system generates a residue using conventional error correction techniques. As with prior techniques, if the residue contains fewer than T non-zero symbols, where T is less than ½ the code distance, d, the system treats the data symbols as error-free. Thus no error correction is required.

If the residue contains T or more non-zero symbols, the system (i) manipulates the residue symbols using the (n,k) code modulo g(x), and (ii) counts the number of non-zero manipulated symbols after every m multiplications, or m-shifts of an (n,k) encoder, where m is a factor of k. If there are more than T non-zero manipulated symbols are m shifts, the system repeats the manipulation and counting operations, keeping a count of the number of repetitions.

Otherwise, it corrects the errors by combining the manipulated symbols with the appropriate code word symbols, that is, by combining a first manipulated residue symbol with the code word symbol in the $m^{th}$ position, a second manipulated residue symbol with the code word symbol in the $m+1^{st}$ position, et cetera. If the system has to perform more than one shifting operation to generate a set of r symbols containing fewer than T non-zero symbols, for example, if it performs y shifting operations, it combines the encoded symbols with the code word symbols in the ym to ym+r−1 positions. Using this error trapping decoding technique, the system can correct up to (n/k)−1 errors with a maximum of n/m counting operations. The system can thus complete the decoding operation relatively quickly.

To save time, the system may perform the entire counting operation in parallel with the next shifting operation. Thus the system copies the manipulated residue symbols into a buffer and counts the non-zero symbols while the encoder continues shifting another m times. If the counting operation counts fewer than T non-zero symbols, the system sues the contents of the buffer to correct the code word. Otherwise, it copies into the buffer the next set of manipulated residue symbols and again counts the non-zero symbols while the system continues shifting.

In order to further enhance the speed with which the error trapping decoding scheme corrects codewords, the system uses an encoder which, in one clock cycle, performs the equivalent of i shifts, where i is a factor of m. The system thus performs a complete "shifting operation" in m/i shifts. The encoder consists of i feedback paths, one path corresponds to $x^r$ modulo the generator polynomial (the conventional feedback path) and the others correspond, respectively, to $x^{r-i+j}$ modulo the generator polynomial for $j=1, \ldots, i-1$, where r has the value of the largest exponent of the generator polynomial, as explained more fully in the detailed description.

The fast encoder may also be used to encode, in k/i clock cycles, k data symbols to generate the associated r redundancy symbols to form a code word. The data symbols, which are applied to the fast encoder in sets of i symbols, are combined with the contents of corresponding redundancy registers, that is, with registers associated with the $x^{r-1}, x^{r-2}, \ldots, x^{r-i}$ symbols. The resulting symbols are then encoded according to the i feedback paths.

BRIEF DESCRIPTION OF THE DRAWINGS

The invention will be pointed out with particularity in the appended claims. The above and other advantages of the invention may be better understood by referring to the following description taken in conjunction with the accompanying drawings, in which:

DETAILED DESCRIPTION

It should be understood that all addition and multiplication operations performed during the error trapping decoding, are Galois Field operations.

1. A Conventional Encoder

Figure 1:
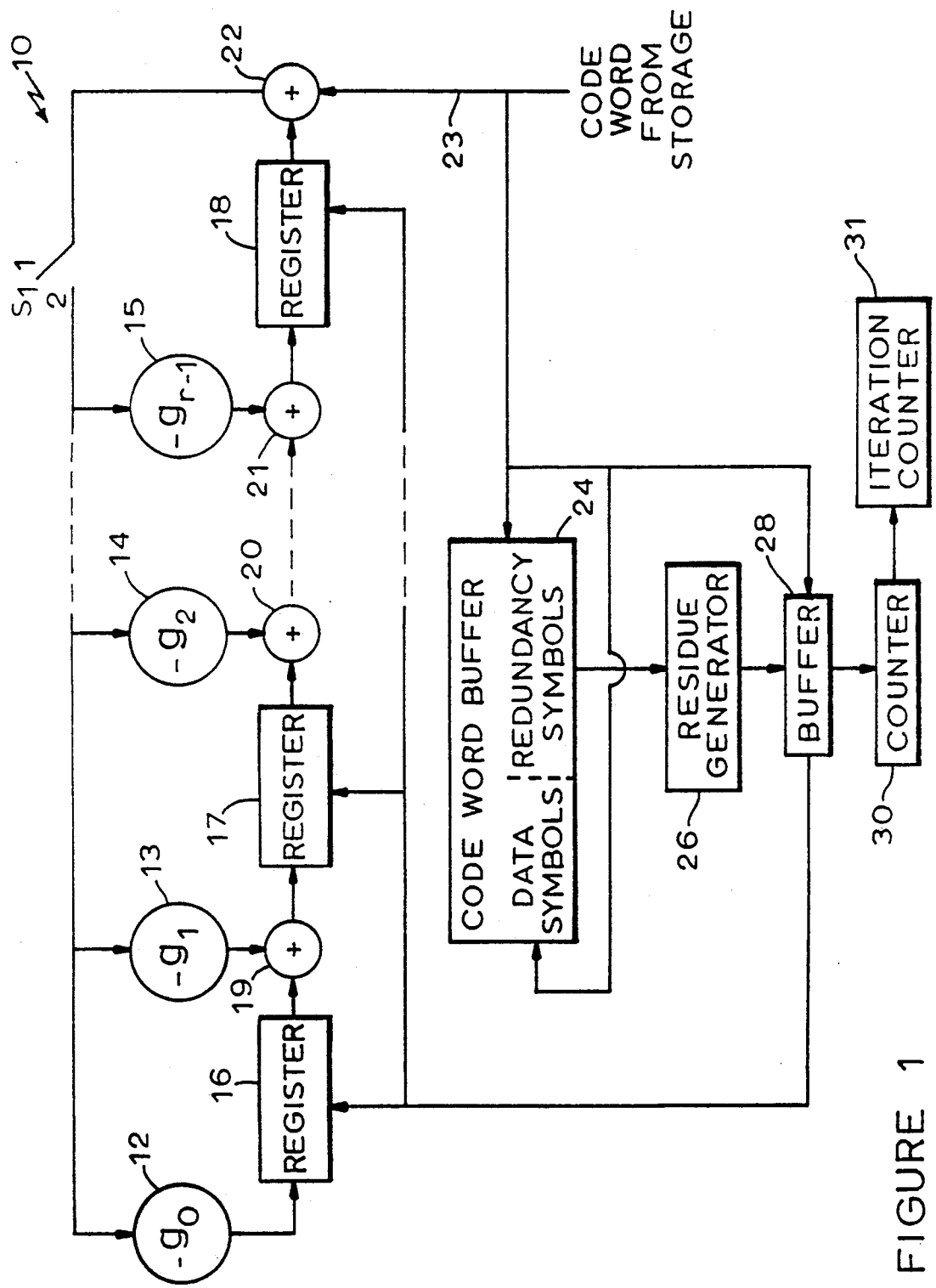
FIG. 1 is a conventional encoder.

FIG. 1 depicts in block diagram form a conventional multi-stage linear feedback encoder 10 used in encoding/decoding systems (not shown) to encode data symbols in accordance with a cyclic (n,k) error correction code over Galois Field $GF(p^q)$. The code generator polynomial g(x) is of the form:

$$g(x)=x^r+g_{r-1}x^{r-1}+g_{r-2}x^{r-2}+g_{r-3}x^{r-3}+\ldots+g_0$$

where the $g_j$'s are elements of $GF(p^q)$, and r is equal to n-k).

The encoder 10 consists of r stages, with each stage including a Galois Field multiplier 12-15, a register 16-18 and a Galois Field adder 19-22. Each Galois Field multiplier 12-15 multiplies the symbols applied to it by a coefficient of the generator polynomial. The multipliers 12-15, adders 19-22 and registers 16-18 are interconnected to encode symbols by dividing them by the generator polynomial g(x). Thus the feedback path is $x^r$ modulo the generator polynomial, and the encoder 10 produces, in registers 16-18, redundancy symbols which are equivalent to the remainder of the k data symbols divided by the generator polynomial g(x), in Galois Field arithmetic.

When a code word is, for example, retrieved from storage, the encoding/decoding system checks it for errors by encoding the code word data symbols to form redundancy symbols and comparing the resulting redundancy symbols with the retrieved code word redundancy symbols. The system thus applies the code word data symbols to the encoder 10 over line 23, while switch $S_1$ is in position 2. As each data symbol is applied to the encoder it is added to the output of register 18 and the sum is then applied simultaneously to each of the multipliers 12-15. The multipliers multiply the sum by the coefficients of the generator polynomial, and the adders 19-22 then add the outputs of the multipliers to the contents of the respective registers 16-18.

After all the data symbols are encoded, the registers 16-18 contain the corresponding redundancy symbols. The redundancy symbols may be read from the registers 16-18 in parallel or they may be obtained serially by shifting the encoder 10 an appropriate number of times with switch $S_1$ in position 1.

In order to determine if there are any errors in the code word, the system generates a residue in residue generator 26 by exclusive OR'ing the generated redundancy symbols and the corresponding redundancy symbols of the retrieved code word. The word resulting symbols are applied to a counter 30 which counts the number of them which are non-zero, that is, the number of symbols which contain one or more binary "1's." If the residue contains fewer than T non-zero symbols, where T is less than ½ of the code distance, d, it is assumed that the code word data symbols are error-free and the errors, if any, are in the redundancy symbols. Accordingly, the system does not perform any error correction.

If the counter 30 counts more than T non-zero residue symbols, it indicates that there are errors in the data symbols. The system corrects the errors, if possible, using a fast error trapping decoding scheme.

2. The Fast Error Trapping Decoding Scheme

Figure 2:
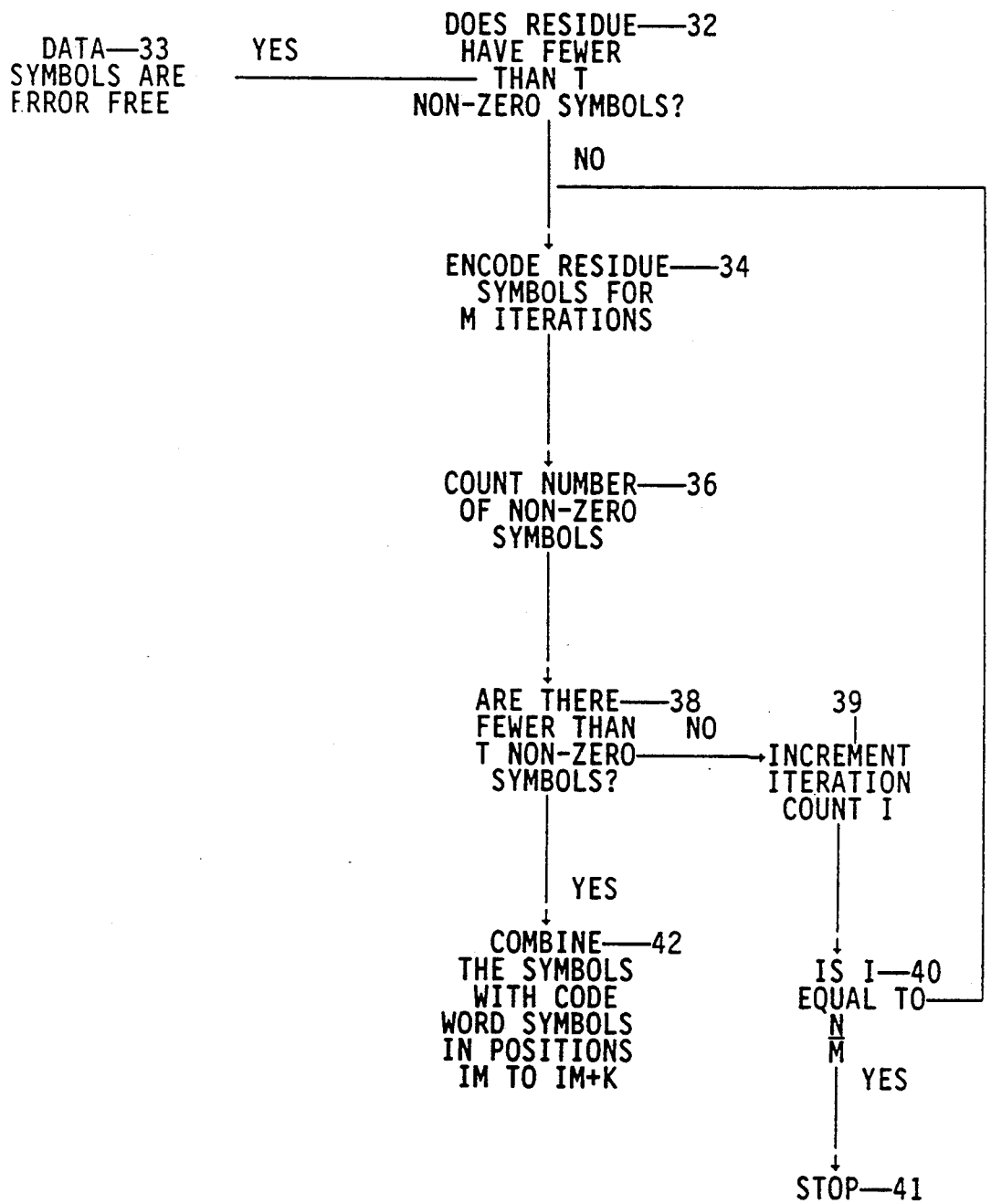
FIG. 2 is a flow chart of the steps performed by a system operating in accordance with the preferred embodiment.

Referring now to FIGS. 1 and 2, the residue symbols are loaded into the registers 16-18 of the encoder 10 (step 32). The encoder 10 then shifts m times, where m, in the preferred embodiment, is a factor of k (step 34), to manipulate the residue symbols in accordance with the same (n,k) code used to encode the data. After the m-shifts, the encoder 10 applies the manipulated residue symbols in registers 16-18 to buffer 28 and the counter 30 counts the number of them which are non-zero (step 36). If the count in counter 30 is less than T, the system combines the encoded symbols in buffer 28 with the appropriate code word symbols in code word buffer 24 (steps 38 and 42). The system thus exclusive OR's the manipulated residue symbol from register 16 with the code word symbol in the $m^{th}$ position, $c_m$, and the symbol from register 17 with the code word symbol in the $m+1^{st}$ position, $c_{m+1}$, et cetera.

If the counter 30 counts more than T non-zero encoded residue symbols, the system increments an iteration counter 31 and, if the count is less than n/m, it shifts the encoder 10 another m times to further manipulate the symbols in registers 16-18 (steps 38-40). After the shifting, the counter 30 again counts the number of non-zero manipulated symbols. If there are still more than T non-zero symbols, the system increments the interation count 31, shifts the encoder 10 another m times and counts the number of non-zero symbols. The system repeats the shifting and counting operations until it generates a set of r symbols which contains fewer than T non-zero symbols.

Once such as set of symbols is generated, the system uses them to correct the code word. If the encoder 10 performs "s" shifting operations to generate the symbol set, that is, if the interation counter 31 is equal to s, the system combines the encoded symbols with the code word symbols $c_{sm}, c_{sm+1}, \ldots, c_{sm+r}$.

If after n/m shift operations the system has not generated a set of symbols which contains fewer than T non-zero symbols, it stops the error trapping decoding (step 41), and either tries to correct the code word using a more powerful error correcting technique or labels the code word uncorrectable.

The fast error trapping decoding system can complete an error correction operation in a maximum of n/m iterations, which is significantly fewer than the number of iterations it takes to complete conventional error trapping decoding operations. The conventional operation examines n windows and can correct up to (n−1)/k errors. The fast error trapping decoding scheme examines n/m windows and can relatively quickly correct up to (n−m)/k errors. If the system performs k shifts between counting operations, that is, m=k, the system can correct (n−k)/k or (n/k)−1 errors. This fast error trapping scheme can thus correct one less error than can conventional techniques, however, it can correct the errors in 1/m the time Accordingly, even if the fast error trapping decoding cannot correct all the errors that the conventional decoding can, it is fast enough to allow the system to use slower techniques to correct the code words it cannot- and still represent a savings of time in the long run, that is, in the time required to correct a number of code words using conventional techniques.

To further reduce the time required to complete the error trapping decoding operation, the system may count the number of non-zero manipulated residue symbols while the encoder is performing a next shifting operation. The system thus loads a copy of the manipulated symbols into the buffer 28, and while the encoder 10 is again shifting m times to further manipulate the residue symbols, the counter 30 counts the number of non-zero symbols in the buffer 28. If there are fewer than T non-zero symbols, the system combines the buffer symbols with the appropriate code word symbols. Otherwise the system copies the next set of manipulated residue symbols into the buffer 28 and counts them while it again shifts the encoder 10 m-times. Similarly, the system may include in each register 16–18 a detector which detects non-zero symbols. Then, before the manipulated residue symbols are copied to a buffer 28, the detector output signals are applied to a set of adders (not shown) which add-up or count them while the encoder 10 continue shifting. When the count is less than T, the buffered symbols are used to correct the code word.

The system may perform the manipulation and counting operations using hardware or software. A hardware system operating in accordance with the invention completes an error trapping decoding operation much faster than one operating in accordance with conventional error trapping decoding techniques. Further, if the counting and shifting portions of the inventive decoding scheme are performed in parallel, the system, whether it is hardware or software, completes the decoding operation significantly faster than a system which is performing a conventional decoding operation, i.e., it completes it in "$1/m^{th}$" the time.

To even further reduce the time required to complete the error trapping decoding operation, the system may use an improved encoder/decoder. The improved encoder/decoder encodes or manipulates symbols the equivalent of "i" shifts in one clock cycle, where i, in the preferred embodiment, is a factor of m. Thus the improved encoder/decoder performs in m/i shifts the encoding or manipulation which takes m shifts of the encoder 10 (FIG. 1). If i equals m, the encoder cycles only once to generate a set of encoded or manipulated symbols.

3. The Fast Encoder

The encoder 10 (FIG. 1) encodes data symbols by dividing them by the generator polynomial. The redundancy symbols are the remainder. One shift of a conventional encoder corresponds to multiplying a symbol x, where x is any symbol in the Galois Field, by an appropriate $x^L$ to the change it in accordance with the generator polynomial g(x) to $x^{L+1}$, for $L=0,1,\ldots,r-1$. When the exponent L equals ore exceeds r−1 the encoder during the shift finds $x^{L+1}$ mod g(x), which is the remainder of $x^{L+1}$ divided by the generator polynomial. This is accomplished using a feedback path.

For example, with the generator polynomial:

$$g(x) = x^r + g_{r-1}x^{r-1} + g_{r-2}x^{r-2} + g_{r-3}x^{r-3} + \ldots + g_0$$

and a shift operation changing $x^{r-1}$ to $x^r$, the encoder generates $x^r$ mod g(x), which is:

$$x^r = -g_{r-1}x^{r-1} + -g_{r-2}x^{r-2} + -g_{r-3}x^{r-3} + \ldots + -g_0 \quad (1)$$

where the negative sign of each term may be dropped if the Galois Field, $GF(p^q)$, over which the code is used is based on a power of two, that is, if p is two.

The feedback path, in accordance with expression 1, goes to each of the Galois Field multipliers 12–15.

When the encoder encodes the equivalent of two shifts, it multiples x by an appropriate $x^L$ to change it to $x^{L+2}$, for $L=0,1,\ldots,r-1$. During the encoding the $x^{r-2}$ and $x^{r-1}$ expressions are each divided by the generator polynomial and only the respective remainders are retained. Accordingly, the encoder generates expressions for $x^r$ mod g(x) and $x^{r+1}$ mod g(x). The expression for $x^r$ mod g(x) is the same as (1) above and the expression for $x^{r+1}$ mod g(x) is $x[x^r]$ which is:

$$x[-g_{r-1}x^{r-1} + -g_{r-2}x^{r-2} + -g_{r-3}x^{r-3} + \ldots + -g_0] \text{ or}$$

$$-g_{r-1}x^r + -g_{r-2}x^{r-1} + -g_{r-3}x^{r-2} + \ldots + -g_0x$$

This expression must be further reduced modulo the generator polynomial by substituting expression (1) for $x^r$:

$$-g_{r-1}[-g_{r-1}x^{r-1} + -g_{r-2}x^{r-2} + -g_{r-3}x^{r-3} + \ldots + -g_0] + -f_{r-2}x^{r-1} + -g_{r-3}x^{-2} + \ldots + -g_0x$$

which after further manipulation is:

$$[g_{r-1}t_{r-1}-g_{r-2}]x'^{-1}+[g^{r-1}g_{r-2}-g_{r-3}]x'^{-2}+$$
$$[g_{r-1}g_{r-3}-g_{r-4}]x'^{-3}+\ldots$$
$$+[g_{r-1}g_{r-1}-g_0]x-g_{r-1}g_0$$

Each coefficient of this expression is, by definition, an element of the Galois Field $GF(p^q)$. Thus if $h_j = g_{r-1}g_j - g_{j-1}$ for $j = 1, 2, \ldots r-1$ and $h_0 = g_{r-1}g_0$, the expression becomes:

$$h_{r-1}x'^{-1} + h_{r-2}x'^{-2} + \ldots + h_1 x + h_0 \quad (2)$$

which can be implemented using a second feedback path.

Figure 3:
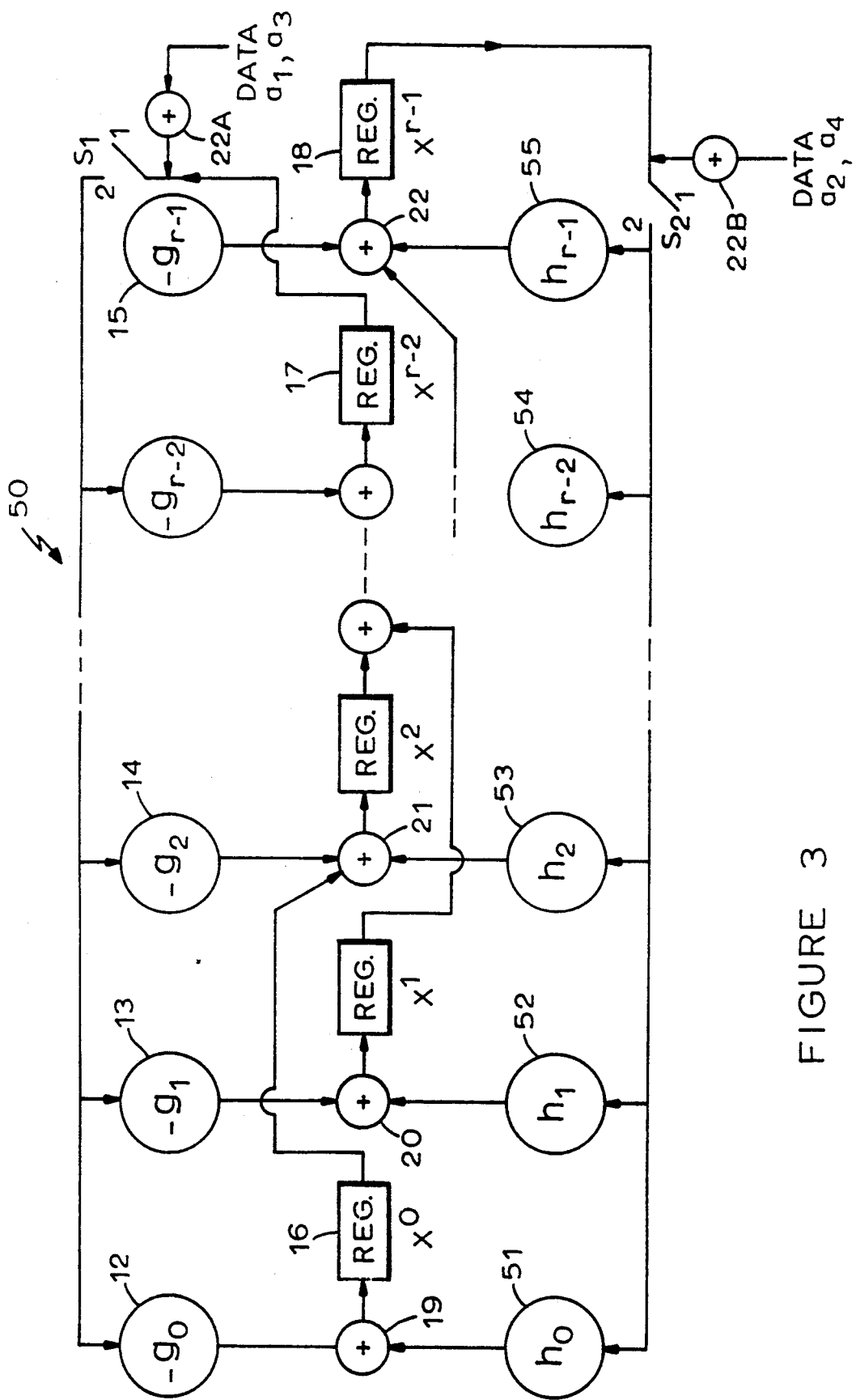
FIG. 3 is an encoder constructed in accordance with a preferred embodiment of the current invention.

Referring now to FIG. 3, an encoder 50 includes two sets of Galois Field multipliers. One set, consisting of multipliers 12-15, multiplies symbols applied to it by each of the coefficients of the generator polynomial. This set generates $x^r \bmod g(x)$. The second set, multipliers 51-55, multiplies symbols applied to it by each of the coefficients of expression (2) above. This set generates $x^{r+1} \bmod g(x)$.

The registers 16-18 and the adders 19-22 are interconnected such that the output line of the register in a particular stage, for example, register 16 in the first stage, is applied to the adder in the stage which is i, or two, stages away, for example, the adder 21.

When $i = 3$, that is, one clock cycle of the encoder is equivalent to three shifts of a conventional encoder, the feedback paths are associated with the $x^r \bmod g(x)$, $x^{r+1} \bmod g(x)$, and $x^{r+2} \bmod g(x)$. Thus there are three feedback paths.

The encoder 50 also encodes k data symbols in k/i clock cycles. Referring again to FIG. 3 which corresponds to $i = 2$, two data symbols $a_1$ and $a_2$ are simultaneous applied to the encoder at points A and B, and the symbols are XOR'd to the contents of registers 17 and 18, respectively. The encoder then encodes the sums in accordance with the two feedback paths, as indicated by the arrows. For $i = 3$, for example, three data symbols are simultaneously applied to the encoder. The symbols are respectively XOR'd to the contents of the registers associated with the last three stages. The sums are then applied to the appropriate feed back paths and encoded.

The fast encoder may be implemented in hardware or software. Each cycle of the inventive encoder implemented in hardware is the equivalent of i cycles of a conventional encoder, and thus, the inventive encoder encodes data in "$1/i^{th}$" the time it takes the conventional one. If the encoder is implemented in software which performs the multiplication in parallel, that is, which multiples the symbols by the appropriate g(x) and h(x) coefficients simultaneously, it also completes the encoding operation in $1/i^{th}$ the time it takes using conventional software.

A system which uses the fast encoder 50 in combination with the fast error trapping decoding scheme can quickly correct $(n-m)/k$ errors. At most, the system sacrifices the ability to correct one error, that is, it corrects $(n/k) - 1$ errors instead of the $(n-1)/k$ errors a conventional system is capable of correcting. However, the speed with which the fast system can correct the errors makes it suitable for high data transfer rate applications. Conventional error trapping decoding systems can not operate efficiently in such applications, thus they force systems to slow the transfer rate.

The foregoing description has been limited to specific embodiments of this invention. It will be apparent, however, that variations and modifications may be made to the invention, with the attainment of some or all of its advantages. Therefore, it is the object of the appended claims to cover all such variations and modifications as come within the true spirit and scope of the invention.

What is claimed is:

1. An error trapping decoding system for use with data which is encoded into n-symbol code words in accordance with an (n,k) code with distance, d, the system comprising:
   A. an encoder for encoding in accordance with the (n,k) code, k code word data symbols of a code word, c, having symbols $c_1$ to $c_n$, said encoder generating $n-k$, or r, redundancy symbols;
   B. residue generating means for generating a residue corresponding to the r redundancy symbols, said residue comprising a set of r symbols;
   C. comparing means for determining if a number of non-zero symbols in the set of residue symbols is greater than a predetermined maximum number, T, which is less than one-half the code distance, d;
   D. iterative means for—
      (i) applying the set of residue symbols to the encoder and thereby generating a set of manipulated residue symbols in accordance with the (n,k) code by shifting the encoder m times, where m is a factor of k, if the number of non-zero symbols is greater than the predetermined maximum number, T; and
      (ii) applying the set of manipulated residue symbols to the comparing means;
   said iterative means repeatedly applying the set of manipulated residue symbols to the encoder and the comparing means until a predetermined number of iterations have been performed or until the encoder generates a set of manipulated residue symbols containing T or fewer non-zero symbols; and
   F. combining means for combining the set of manipulated residue symbols containing T or fewer non-zero symbols with the code word symbols associated with the number iterations performed to correct errors in the code word, c.

2. The error trapping encoding system of claim 1, wherein said system includes an iteration counter for counting the number of times the encoding and counting operations are repeated.

3. The error trapping encoding system of claim 2, wherein said combining means combines with a code word symbols $c_{sm}$ to $c_{sm+4-1}$, where s is the number of the iteration performed by set iterative means.

4. A method of correcting errors in n-symbol code words which are encoded in accordance with an (n,k) code with distance, d, said method comprising:
   A. encoding in an encoder organized in accordance with the (n,k) code, k code word data symbols of a code word, c, having symbols $c_1$ to $c_n$, said encoder generating $n-k$, or r, redundancy symbols;
   B. generating an r-symbol residue corresponding to the r redundancy symbols;
   C. determining if a number of non-zero symbols in the residue is greater than a predetermined maximum number, T, which is less than one-half the code distance, d;
   D. if the number of non-zero symbols is greater than the predetermined maximum number, T, manipulating the residue symbols in the encoder in accordance with the (n,k) code by shifting the encoder m times, where m is a factor of k, the encoder generating a set of manipulated residue symbols;

D. determining if the number of non-zero symbols in the set of manipulated residue symbols is greater than T;

F. if the number of non-zero manipulated residue symbols in the set is greater than T, repeating the manipulation and determining steps D and E until the encoder generates a symbol set containing T or fewer non-zero symbols or until a predetermined number of repetitions have been performed; and G. combining the set of manipulated residue symbols containing T or fewer non-zero symbols with the code word symbols associated with the number iterations performed to correct errors in the code word.

5. The error correction method of claim 4, wherein said step of combining the set of manipulated residue symbols with the code word symbols includes combining the set with the code word symbols $c_{sm}$ to $c_{sm+k}$, where s is the number of repetitions of the manipulation and counting steps.

6. The error correction method of claim 4, wherein the encoder encodes the k codeword data symbols in k/i iterations.

7. The error correction method of claim 4, wherein said manipulation and counting steps are performed concurrently.

8. An encoder for encoding in k/i where i is any number less than k clock cycles k data symbols in accordance with an (n,k) code which has a generator polynomial $g(x)=x^r+g_{r-1}x^{r-1}+g_{r-2}x^{r-2}+g_{r-3}x^{r-3}+\ldots+g_0$, said encoder comprising:

A. $n-k$, or r, stages with each stage including a Galois Field adder, a register and i Galois Field multipliers, each of which is associated with a corresponding coefficient of $x^{r-i+j}$ mod $g(x)$, for $j=1,\ldots,i$;

B. i input lines, one for each of i symbols which are applied to the encoder simultaneously, one of said input lines connecting to the output line of the register in the last, or r stage, one line connecting to the output line of the register in the $r-1$ stage and so on with the last of the input lines connecting to the output line of the register in the $r-i$ stage; and C. i feedback paths each of which is associated with an expression $x^{r-i+j}$ modulo $g(x)$, for $j=1,\ldots,i$ which includes the Galois Field multipliers associated with the coefficients of the respective expression;

the i symbols applied to the encoder are simultaneously encoded by the feedback path associated with the applicable register and added to the symbols produced in the various feedback paths to produce, in the registers after all k data symbols are encoded, r redundancy symbols.

9. The encoder of claim 8, wherein the output lines of the registers in stage j are connected to the adders in stage $j+i$, for $j=1,2,\ldots,r-i$, and the output lines of the registers in stages $r-i$ to r, respectively, are connected to the multipliers in the feedback paths associated with $x^{r-i+j}$ for $j=1,2\ldots,i$.

10. An error trapping decoding system for use with data which is encoded into n-symbol code words in accordance with an (n,k) code with distance, d, the system comprising:

A. an encoder for encoding k code word data symbols in accordance with the (n,k) code in k/i where i is any number less than k clock cycles a code word, c, having symbols $c_1$ to $c_n$, said encoder generating $n-k$, or r, redundancy symbols;

B. residue generating means for generating an r-symbol residue corresponding to the r redundancy symbols;

C. comparing means for determining if a number of non-zero symbols in the set of residue symbols is greater than a predetermined maximum number, T, which is less than one-half the code distance, d;

D. iterative means for—
  (i) applying the set of residue symbols to the encoder and thereby generating a set of manipulated residue symbols in accordance with the (n,k) code by shifting the encoder m/i times, where m is a factor of k and i is a factor of m, if the number of non-zero symbols is greater than the predetermined maximum number, T;
  (ii) applying the set of manipulated residue symbols to the comparing means;
  said iterative means repeatedly applying the set of manipulated residue symbols to the encoder and the comparing means until the encoder generates a set of manipulated residue symbols containing T or fewer non-zero symbols or until a predetermined number of iterations have been performed;

E. means for counting the number of iterations performed by the iterative means; and F. means for combining the set of manipulated residue symbols containing T or fewer non-zero symbols with the code word symbols associated with the number of iterations performed to correct errors in the code word.

11. The error trapping decoding system of claim 10, wherein said encoder includes:

A. r stages with each stage including a Galois Field adder, a register and i Galois Field multipliers, each of which is associated with a corresponding coefficients of $x^{r-1+j}$ mod $g(x)$, for $j=1,\ldots,i$;

B. i input lines, one for each of i symbols which are applied to the encoder simultaneously, one of said input lines connecting to the output line of the register in the last, or r stage, one line connecting to the output line of the register in the $r-1$ stage and so on with the last of the input lines connecting to the output line of the register in the $r-i$ stage; and C. i feedback paths each of which is associated with an expression $x^{r-i+j}$ modulo $g(x)$, for $j=1,\ldots,i$ which includes the Galois Field multipliers associated with the coefficients of the respective expression;

the i symbols applied to the encoder are simultaneously encoded by the feedback path associated with the applicable register to produce in the registers after all k data symbols are encoded, r redundancy symbols.

12. The error trapping decoding system of claim 11, wherein the encoder, includes registers which are connected such that the output lines of the registers in stage j are connected to the adders in stage $j+i$, for $j=1,2,\ldots,r-i$, and the output lines of the registers in stages $k-i$ to k, respectively, are connected to the multipliers in the feedback paths associated with $x^{r-i+j}$ for $j=1,2,\ldots,i$.

* * * * *